United States Patent
Usagawa et al.

(10) Patent No.: US 12,259,432 B2
(45) Date of Patent: Mar. 25, 2025

(54) MOTOR CONTROL SYSTEM

(71) Applicant: ROHM CO., LTD., Kyoto (JP)

(72) Inventors: Naoyuki Usagawa, Kyoto (JP); Takashi Esumi, Kyoto (JP); Tatsuro Shimizu, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 17/388,461

(22) Filed: Jul. 29, 2021

(65) Prior Publication Data
US 2022/0034969 A1 Feb. 3, 2022

(30) Foreign Application Priority Data
Aug. 3, 2020 (JP) ................................. 2020-131539

(51) Int. Cl.
*G01R 31/34* (2020.01)
*G01R 23/04* (2006.01)
(Continued)

(52) U.S. Cl.
CPC ........... *G01R 31/343* (2013.01); *G01R 23/04* (2013.01); *G01R 27/32* (2013.01); *H02P 23/14* (2013.01)

(58) Field of Classification Search
CPC ...... G01R 31/343; G01R 23/04; G01R 23/02; G01R 27/32; H02P 23/14; H02P 29/024; G05B 19/0423; G05B 2219/25257
See application file for complete search history.

(56) References Cited

U.S. PATENT DOCUMENTS

2004/0179831 A1* 9/2004 Tsuruta ................. G05B 19/19
388/825
2008/0037158 A1* 2/2008 Kim ..................... G11B 5/5582
(Continued)

FOREIGN PATENT DOCUMENTS

JP H11-065668 3/1999
JP 2001-175303 6/2001
(Continued)

OTHER PUBLICATIONS

CN OA & SR—The State Intellectual Property Office of People's Republic of China, Office Action in Chinese Appln. No. 202110849064.9, dated Nov. 29, 2023, 19 pages (with English translation).
(Continued)

*Primary Examiner* — Catherine T. Rastovski
*Assistant Examiner* — Lal C Mang
(74) *Attorney, Agent, or Firm* — Fish & Richardson P.C.

(57) ABSTRACT

The present disclosure relates to a motor control system including: a motor control device, including a semiconductor integrated circuit having a memory and forming a control loop for a motor so as to control a drive of the motor; and an external debug device, externally connected to the motor control device and accessible to the memory in the motor control device. The external debug device includes a disturbance signal superimposer and a frequency characteristics deriver. The interference signal superimposer generates a disturbance signal for the control loop and superimposes the disturbance signal on a signal generated in the control loop. The frequency characteristics deriver derives frequency characteristics of the control loop based on the signal generated in the control loop by superimposition.

14 Claims, 6 Drawing Sheets

(51) Int. Cl.
*G01R 27/32* (2006.01)
*H02P 23/14* (2006.01)

(56) References Cited

U.S. PATENT DOCUMENTS

| | | | | |
|---|---|---|---|---|
| 2012/0330483 | A1* | 12/2012 | Campbell | ................... 701/22 |
| 2016/0085217 | A1* | 3/2016 | Bauer | ................ G05B 6/02 |
| | | | | 318/624 |
| 2017/0205794 | A1* | 7/2017 | Wichowski | ........ G05B 19/045 |
| 2020/0218206 | A1* | 7/2020 | Suzaki | ............ G06F 11/3664 |

FOREIGN PATENT DOCUMENTS

| | | |
|---|---|---|
| JP | 2002-116802 | 4/2002 |
| JP | 2002-304219 | 10/2002 |
| JP | 2017-169258 | 9/2017 |

OTHER PUBLICATIONS

Japanese Patent Office, Office Action in Japanese Appln. No. 2020-131539, dated Apr. 9, 2024, 34 pages (with English Translation).

CN OA—The State Intellectual Property Office of People's Republic of China, Office Action in Chinese Appln. No. 202110849064.9, dated Aug. 1, 2024, 18 pages (with English translation).

JP OA—Japanese Patent Office, Office Action in Japanese Appln. No. 2020-131539, dated Aug. 20, 2024, 4 pages (with English translation).

\* cited by examiner

MOTOR CONTROL SYSTEM

BACKGROUND OF THE INVENTION

1. Field of the Invention

The present disclosure relates to a motor control system.

2. Description of the Prior Art

To evaluate such as stability of motor control, there are methods for measuring frequency characteristics of a motor control loop. The measured frequency characteristics are usually represented in the form of a Bode plot. To render a Bode plot, costly measurement equipment such as a frequency response analyzer (FRA) is also frequently used.

On the other hand, there are motor control devices built in with structures having functions for measuring frequency characteristics.

PRIOR ART DOCUMENT

Patent Publication

[Patent document 1] Japan Patent Publication No. 2002-304219

BRIEF SUMMARY OF THE INVENTION

Problems to be Solved by the Invention

However, if a frequency characteristics measurement function is to be provided on a motor control device, resources (such as memory capacity) of the motor control device may be constricted, leading to an increased product cost of the motor control device.

It is an object of the present disclosure to provide a motor control system that helps suppressing a cost increase caused by frequency characteristics derivation.

Technical Means for Solving the Problem

The motor control system of the present disclosure is configured as below (first configuration); that is, motor control system includes: a motor control device, including a semiconductor integrated circuit having a memory, and forming a control loop for a motor so as to control driving of the motor; and an external debug device, externally connected to the motor control device, capable of accessing the memory, the external debug device including a disturbance signal superimposer and a frequency characteristics deriver. The disturbance signal superimposer generates a disturbance signal for the control loop and superimposes the disturbance signal on a signal generated in the control loop. The frequency characteristics deriver derives frequency characteristics of the control loop based on the signal generated in the control loop by superimposition.

The motor control system of the present disclosure may also be configured as below (second configuration); that is, in the motor control system of the first configuration, the external debug device includes a debugger including an external signal output unit and a computing device including the frequency characteristics deriver. The debugger is externally connected to the motor control device, and is arranged between the computing device and the motor control device. The debugger is configured to superimposes, under an instruction of the computing device, the disturbance signal between the computing device and the motor control device. The signal generated in the control loop by superimposition is transmitted from the motor control device to the computing device through the debugger.

The motor control system of the present disclosure may also be configured as below (third configuration); that is, in the motor control system of the first or second configuration, the external debug device further includes a display that displays a Bode plot as a diagram representing the frequency characteristics.

The motor control system of the present disclosure may also be configured as below (fourth configuration); that is, in the motor control system of any of the first to third configurations, the frequency characteristics are derived by the frequency characteristics deriver while the driving of the motor is continually controlled by the motor control device when the disturbance signal is superimposed starting from a state in which the motor control device alone controls the driving of the motor without superimposing the disturbance signal.

The motor control system of the present disclosure may also be configured as below (fifth configuration); that is, in the motor control system of any of the first to fourth configurations, the external debug device monitors another signal in the motor control device while the frequency characteristics are derived by superimposing the disturbance signal, wherein the another signal is a signal different from the signal referenced by the frequency characteristics deriver for deriving the frequency characteristics.

The motor control system of the present disclosure may also be configured as below (sixth configuration); that is, in the motor control system of any of the first to fifth configurations, the external debug device further includes a transfer function estimator that estimates a transfer function of the control loop based on the derived frequency characteristics.

The motor control system of the present disclosure may also be configured as below (seventh configuration); that is, in the motor control system of the sixth configuration, the external debug device further includes a gain adjustor adjusting a gain of the control loop according to the estimated transfer function.

The motor control system of the present disclosure may also be configured as below (eighth configuration); that is, in the motor control system of any of the first to seventh configurations, the motor control device performs speed control of coinciding or approximating a rotating speed of the motor with respect to a speed command in the control loop, and the external signal output unit superimposes the disturbance signal on the speed command.

The motor control system of the present disclosure may also be configured as below (ninth configuration); that is, in the motor control system of any of the first to eighth configurations, the disturbance signal superimposer generates a digital noise including signal components of each frequency within a predetermined band as the disturbance signal.

Effects of the Invention

According to the present disclosure, a motor control system that helps suppressing a cost increased caused by frequency characteristics derivation is provided.

BRIEF DESCRIPTION OF THE DRAWINGS

FIGS. 4(a) and 4(b) are diagrams for illustrating operations of a read access and a write access in a debug operation according to the first embodiment of the present disclosure;

DETAILED DESCRIPTION OF THE INVENTION

Details of examples of the embodiments of the present disclosure are given with the accompanying drawings below. In the reference drawings, the same parts are denoted by the same numerals or symbols, and repeated description related to the same parts is in principle omitted. Further, to keep the description of the application simple, the names of corresponding information, signals, physical quantities, elements or parts corresponding to the numerals or symbols are sometimes omitted by denoting numerals or symbols of reference information, signals, physical quantities, elements or parts.

First Embodiment

Figure 1:
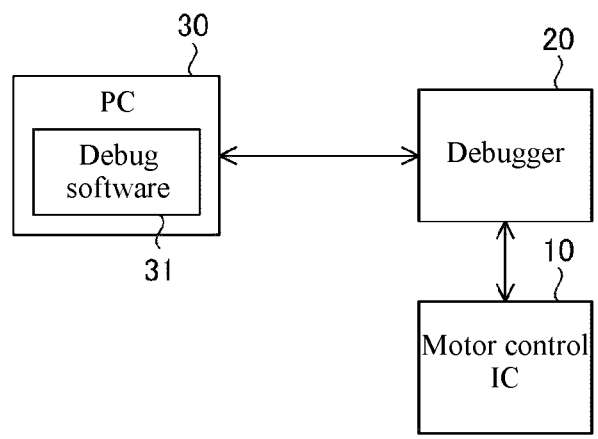
FIG. 1 is a block diagram of an overall configuration of a motor control system according to a first embodiment of the present disclosure.
Figure 2:
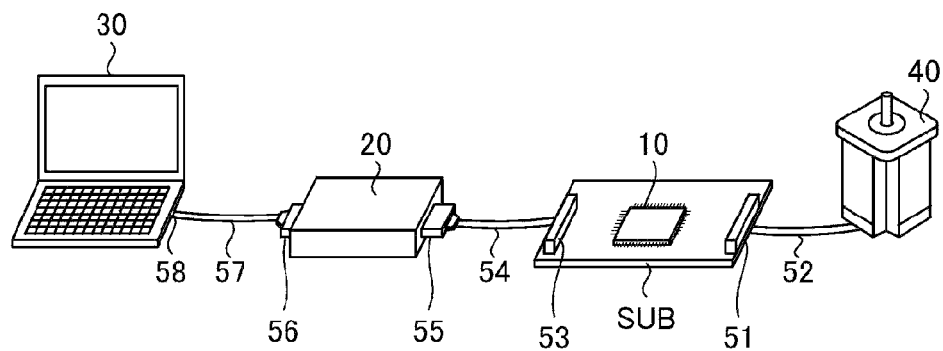
FIG. 2 is a diagram of an overall configuration of a motor control system according to the first embodiment of the present disclosure.

The first embodiment of the disclosure is described below. FIG. 1 shows a block diagram of an overall configuration of a motor control system according to the first embodiment of the present disclosure. The motor control system according to the first embodiment includes: a motor control integrated circuit (IC) 10, functioning as a motor control device or including a motor control device; a debugger 20; and a personal computer (PC) 30 as an example of a computing device. The term IC refers to an integrated circuit. FIG. 2 shows a diagram of an overall configuration of a motor driving system including the motor control system of the first embodiment and a motor 40.

The motor control IC 10 is an electronic component formed by packaging a semiconductor chip formed with a semiconductor integrated circuit into a housing (package) including a sealing resin and sealed therein. A plurality of external terminals is provided in an exposed manner on the housing of the motor control IC 10. As shown in FIG. 2, the motor control IC 10 is mounted on a substrate SUB, and the external terminals are electrically connected to corresponding wiring patterns (not shown) on the substrate SUB. The motor control IC 10 inputs and outputs signals from and to circuits and devices outside the motor control IC 10 through the external terminals. Moreover, the number of the external terminals of the motor control IC 10 and the appearance of the motor control IC 10 shown in FIG. 2 are only exemplary.

In addition, a plurality of electronic components and circuits other than the motor control IC 10 may be further mounted on the substrate SUB, and these components and circuits are omitted from FIG. 2.

Figures 3, 4:
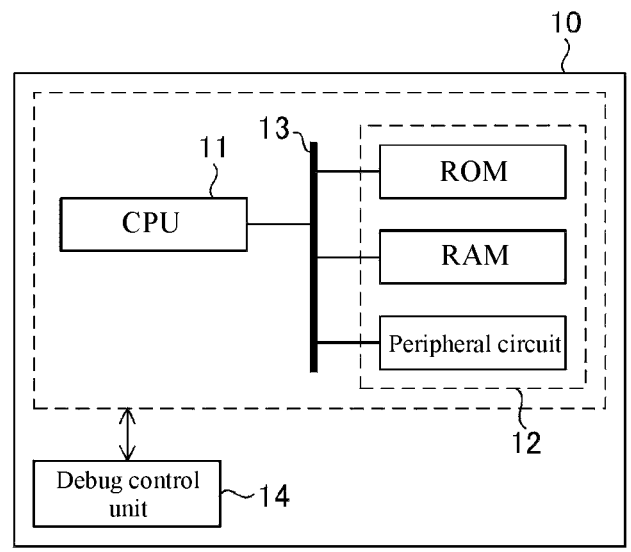
FIG. 3 is a block diagram of a brief configuration of a monitor control integrated circuit (IC) according to the first embodiment of the present disclosure.

FIG. 3 shows a block diagram of a brief configuration of the motor control IC 10. The semiconductor integrated circuit in the motor control IC 10 forms a central processing unit (CPU) 11, a memory 12 and a debug control unit 14. To describe the functions, the CPU 11, the memory 12 and the debug control unit 14 are shown; however, these parts may be combined into a large scale integration (LSI) circuit in the motor control IC 10.

The CPU 11 is connected to the memory 12 by a bus 13, and is capable of accessing the memory 12 through the bus 13. Accessing the memory 12 refers to performing data write to the memory 12 (that is, writing data to the memory 12) or data read from the memory 12 (that is, reading data stored in the memory 12). The memory 12 has one or more one read-only memories (ROM), one or more random access memories (RAM) and one or more peripheral devices serving as one or more peripheral circuits. Moreover, it may be considered that a register (not shown) provided on the CPU 11 is also included in the memory 12. However, the CPU 11 can access the register without going through the bus 13.

The CPU 11 controls driving of the motor 40 by executing a motor control program stored in the motor control IC 10. The motor control program is stored in the ROM in the memory 12 or a program ROM (not shown) arranged in the motor control IC 10.

The debug control unit 14 is a module that does not take part in original driving control of the motor 40, and includes such as a small-size microcomputer. The debug control unit 14 collaborates with the debugger 20 and the PC 30 to assist the debug operation described below.

As shown in FIG. 2, a connector 51 is mounted on the substrate SUB, and the connector 51 is connected to the motor 40 by a wire 52. The motor control IC 10 operates by way of a current supplied to the motor 40 through the connector 51 and the wire 52, and drives the motor 40 by supplying the current (to cause the motor 40 to generate torque so as to rotate the motor 40). A connector 53 is further mounted on the substrate SUB. Connectors 55 and 56 are mounted on the debugger 20, and a connector 58 is mounted on the PC 30. The connectors 53 and 55 are connected by a wire 54, and the connectors 56 and 58 are connected by a wire 57.

The debugger 20 and the substrate SUB may be connected by the wire 54, or may not be connected by the wire 54 (in other words, the debugger 20 and the motor control IC 10 may be connected by the wire 54 in between, or may not be connected by the wire 54). When the debugger 20 and the substrate SUB are connected by the wire 54 in between, the debugger 20 is connected to the motor control IC 10 on the substrate SUB, and the debugger 20 and the motor control IC 10 can perform bidirectional communication of any signals through the connector 53, the wire 54 and the connector 55. When the debugger 20 and the substrate SUB are not connected by the wire 54 in between, the debugger 20 and the motor control IC 10 on the substrate SUB are not connected and cannot perform bidirectional communication. Signal exchange between the debugger 20 and the motor control IC 10 is performed by the debug control unit 14.

The debugger 20 and the PC 30 may be connected by the wire 57, or may not be connected by the wire 57. When the debugger 20 and the PC 30 are connected by the wire 57 in between, the debugger 20 and the PC 30 can perform bidirectional communication of any signals through the connector 56, the wire 57 and the connector 58; the debugger 20 and the PC 30 cannot perform the bidirectional communication when not connected by the wire 57.

Unless otherwise specified below, the debugger 20 and the substrate SUB are connected by the wire 54, and the debugger 20 and the PC 30 are connected by the wire 57. Moreover, in this embodiment, a signal or any information represented (control amount, status amount and physical quantity) or information indicated by the signal is sometimes referred to as data.

Debug software 31 (referring to FIG. 1) is executed on the PC 30. A user of the motor driving system (to be referred to as the user) is allowed to perform, by operating the PC 30 currently executing the debug software 31, a debug operation on the program executed by the CPU 11. In the debug operation, the memory 12 can be accessed through the debugger 20 and the PC 30. That is, the debugger 20 and the PC 30 can be externally connected to the motor control IC 10, and function as an external debug device capable of accessing the memory 12.

That is, for example, the user can input an operation $OP_{READ}$ to the PC 30 an instruction for reading data in the debug operation, as shown in FIG. 4(a). Once the operation $OP_{READ}$ is received, the PC 30 sends a request signal $REQ_{READ}$ corresponding to the operation $OP_{READ}$ to the debugger 20. Once the request signal $REQ_{READ}$ is received, the debugger 20 sends a read command $COM_{READ}$ corresponding to the request signal $REQ_{READ}$ to the motor control IC 10. With the operation $OP_{READ}$, a program variable or a read target address in the memory 12 is specified, and the request signal $REQ_{READ}$ and the read command $COM_{READ}$ include information of the read target address. The read command $COM_{READ}$ is received by the debug control unit 14. Once the read command $COM_{READ}$ is received, the debug control unit 14 accesses the read target address in the memory 12, reads data in the read target address, uses the read data as data $D_{READ}$ and sends the same to the debugger 20. The data $D_{READ}$ is sent to the PC 30 from the debugger 20, and the PC 30 acquires the data $D_{READ}$. Moreover, in another method of specifying the program variable or the read target address in the memory 12 by the operation $OP_{READ}$, information generated when firmware written in the C language is converted (translated) to a machine language may also be used.

In addition, for example, the user can input an operation $OP_{WRITE}$ to the PC 30 an instruction for writing data in the debug operation, as shown in FIG. 4(b). Once the operation $OP_{WRITE}$ is received, the PC 30 sends a request signal $REQ_{WRITE}$ corresponding to the operation $OP_{WRITE}$ to the debugger 20. Once the request signal $REQ_{WRITE}$ is received, the debugger 20 sends a write command $COM_{WRITE}$ corresponding to the request signal $REQ_{WRITE}$ to the motor control IC 10. With the operation $OP_{WRITE}$, a program variable or a write target address and write data (equivalent to data supposed to be written to the write target address) in the memory 12 is specified, and the request signal $REQ_{WRITE}$ and the write command $COM_{WRITE}$ include information of the write target address and information of the write data. The write command $COM_{WRITE}$ is received by the debug control unit 14. Once the write command $COM_{WRITE}$ is received, the debug control unit 14 accesses the write target address in the memory 12, and writes the write data to the write target address. Moreover, in another method of specifying the program variable or the write target address in the memory 12 by the operation $OP_{WRITE}$, information generated when firmware written in the C language is converted (translated) to a machine language may also be used.

Access to the memory 12 is as described above; however, in addition to implementing access to the memory 12, various processes may also be performed in the debug operation. For example, in the debug operation, the user may also interrupt by operating the PC 30 a program currently executed by the CPU 11, or refer to or modify the state of a state machine in the CPU 11.

Figure 5:
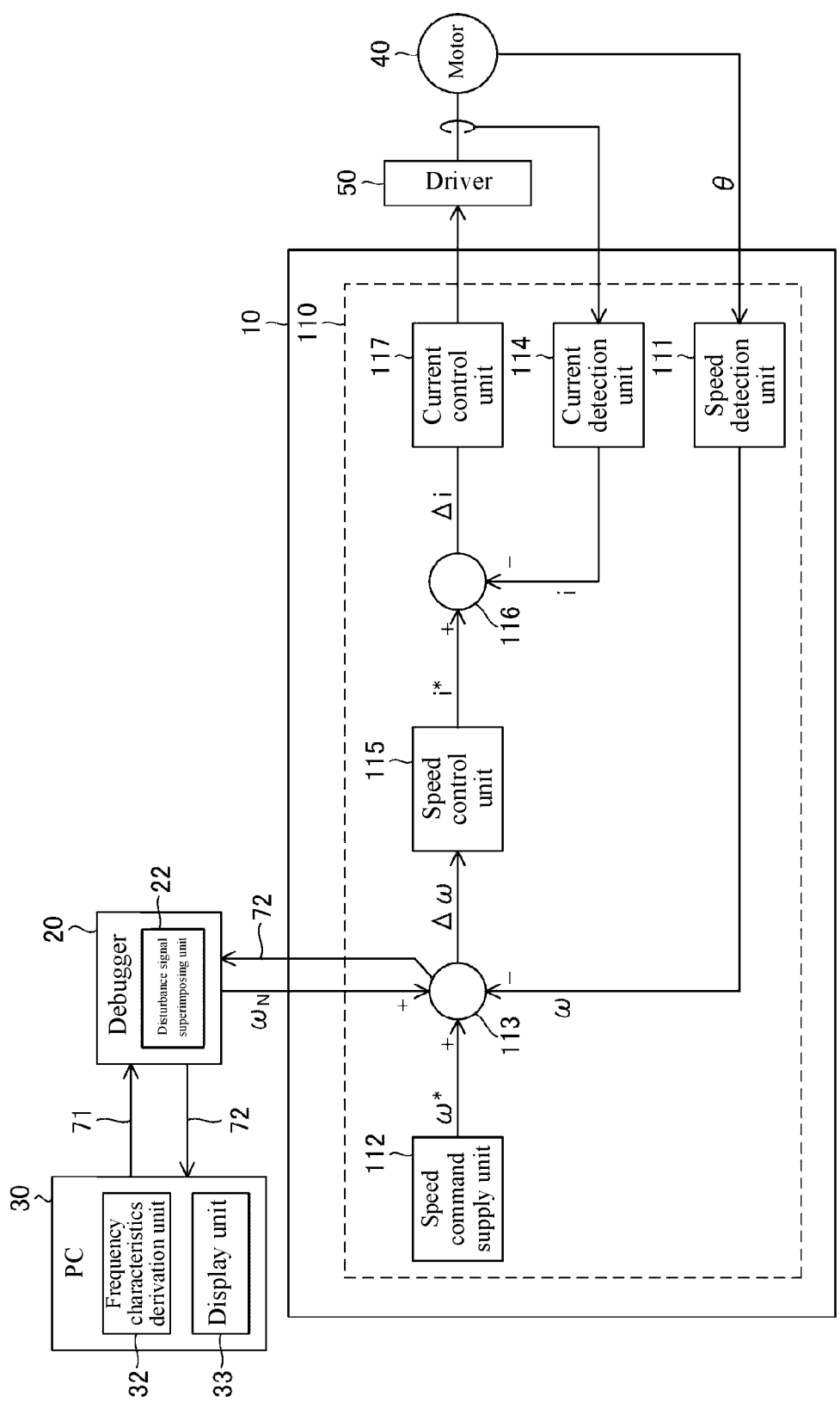
FIG. 5 is a functional block diagram of a motor control system according to the first embodiment of the present disclosure.

FIG. 5 shows a functional block diagram of a motor driving system according to the first embodiment. The motor control IC 10 includes a motor control unit 110 for driving and controlling the motor 40. A driver 50 is provided between the motor control IC 10 and the motor 40. However, as a variation, the driver 50 may also be built in the motor control IC 10.

The motor control unit 110 includes a speed detection unit 111, a speed command supply unit 112, a subtractor (arithmetic calculator) 113, a current detection unit 114, a speed control unit 115, a subtractor 116 and a current control unit 117 as function modules. The function modules may be implemented by the motor control program executed by the CPU 11.

The motor 40 includes a stator of an armature winding, and a rotor rotated and driven by supplying a current to the armature winding. In this embodiment, supplying a current to the motor 40 specifically refers to supplying a current to the armature winding of the motor 40, and rotation of the motor 40 specifically refers to rotation of the rotor. A rotation angle of the rotor from a predetermined reference state of the rotor is referred to as a rotor position θ. A position detector (not shown) for detecting the rotor position θ is mounted on the motor 40. The position detector includes, for example, a rotation encoder or decomposer. The speed detection unit 111 detects a rotating speed ω of the motor 40 based on a detection result of the position detector (that is, by performing differentiation on the rotor position θ detected). The rotating speed ω represents the rotating speed of the rotor in terms of electric angle.

The speed command supply unit 112 provides a signal of a speed command ω* indicating a target value of the rotating speed ω to the subtractor 113. The speed command ω* is determined according to a signal provided by an upper circuit (not shown) arranged outside the motor control IC 10 to the motor control IC 10. However, in an application where the speed command ω* is fixed, the speed command ω* may also be set in the motor control IC 10, regardless of what the signal from the upper circuit is.

The subtractor 113 obtains a speed difference Δω between the signal of the rotating speed ω obtained by the speed detection unit 111 and the signal of the speed command ω* provided by the speed command supply unit 112 based on these two signals. However, to obtain the speed error Δω, a disturbance signal $ω_N$ is sometimes inputted from the debugger 20 to the subtractor 113 (that is, sometimes the disturbance signal $ω_N$ is superimposed on the speed command ω*), and the speed error Δω obtained is then represented as "Δω=ω*−ω+$ω_N$". In FIG. 5, the disturbance signal $ω_N$ is inputted to the subtractor 113. When the disturbance signal $ω_N$ is not inputted to the subtractor 113, "$ω_N$=0", and thus "Δω=ω*−ω".

The current detection unit 114 detects the current supplied from the driver 50 to the armature winding of the motor 40, i.e., a motor current i (that is, detecting the value of the motor current i). For example, the current detection unit 114 may use a current sensor provided between the driver 50 and the motor 40 to detect the motor current i. A signal of the motor current i detected is sent to the subtractor 116.

The speed control unit 115 generates, according to the speed difference Δω, a current command i* representing a target value of the motor current i, and outputs the signal of the current command i* to the subtractor 116. At this point, the speed control unit 115 generates the current command i* by way of converging the speed error Δω to zero using proportional integration control.

The subtractor 116 obtains a speed difference Δi between the signal of the motor current i detected by the current detection unit 114 and the signal of the current command i* provided from the speed control unit 115 based on these two signals. The current error Δi is represented by "Δi=i*−i".

The current control unit 117 controls the driver 50 according to the current error Δi, and accordingly supplies a current to the motor 40. At this point, the current control unit 117 controls the driver 50 by way of converging the current error Δi to zero using proportional integration control. More specifically, the current control unit 117 generates, according to the current error Δi, the driving control signal for the driver 50 by way for converging the current error Δi to zero, and provides the driving control signal to the driver 50. The driver 50 supplies a current corresponding to the driving control signal to the armature winding of the motor 40. The driver 50 includes, for example, an inverter circuit, which generates a pulse width modulated square wave voltage from a predetermined direct-current (DC) voltage and provides the square wave voltage to the armature winding so as to supply the motor current i to the motor 40.

Inclusive of the number of phases of the motor 40, the type of the motor 40 may be any as desired. However, for example, the motor 40 is typically a three-phase permanent magnet synchronous motor, which includes a rotor provided with a permanent magnet, and a stator provided with armature windings having a U phase, a V phase and a W phase. In this case, in a rotating coordinate system that rotates at the same speed as the rotating speed of magnetic flux produced by the permanent magnet of the rotor, the direction of the magnetic flux produced by the permanent magnet is the d axis, and the axis orthogonal to the d axis is the q axis. Thus, an angle (phase) of the d-axis observed from a predetermined fixed axis (e.g., the fixed axis of the U-phase armature winding) is equivalent to the rotation angle (i.e., the rotor position θ) of the motor 40, and the rotating speed ω of the motor 40 is equivalent to the rotating speed of the d-axis (an angular velocity in terms of electric angle).

Moreover, when the motor 40 is a three-phase permanent magnet synchronous motor, the driver 50 includes a three-phase inverter circuit that supplies a current to the armature winding of each phase, and the motor current i, the current command i* and the current error Δi are respectively vectors. To perform vector control on the motor 40, for example, based on the detection value of the current flowing in the armature winding of each phase by the current sensor, and the rotor position θ detected by the position detector, the d-axis component ($i_d$) and the q-axis component ($i_q$) of the current supplied from the driver 50 to the motor 40 are obtained, and the d-axis component and q-axis component obtained are used as the signal of the motor current i and sent to the subtractor 116. Then, the speed control unit 115 includes target values ($i_d^*$ and $i_q^*$) of the d-axis component ($i_d$) and the q-axis component ($i_q$) of the current supplied from the driver 50 to the motor 40 in the signal of the current command I*, and the current control unit 117 controls the driver 50 by way of coinciding the d-axis component ($i_d$) and the q-axis component ($i_q$) of the current supplied from the driver 50 to the motor 40 with their respective target values ($i_d^*$ and $i_q^*$).

In the motor driving system, the external debug device including the debugger 20 and the PC 30 is connected to the motor control IC 10, accordingly performing a frequency characteristics measurement process. In the frequency characteristics measurement process, frequency characteristics of a control loop formed by the motor control unit 110 are measured. The frequency characteristics measurement process is implemented by a disturbance signal superimposer 22 and a frequency characteristics deriver 32. The disturbance signal superimposer 22 is provided on the debugger 20, and the frequency characteristics deriver 32 is provided on the PC 30. The debug software 31 (referring to FIG. 1) is executed by the PC 30 to implement the function of the frequency characteristics deriver 32. Moreover, the PC 30 is provided with a display 33 formed by such as a liquid crystal display panel.

After the user inputs a predetermined frequency characteristics instruction operation to the PC 30, a request signal 71 is sent from the PC 30 (for example, from the frequency characteristics deriver 32) to the debugger 20. After the debugger 20 receives the request signal 71, the disturbance signal superimposer 22 generates the disturbance signal $\omega_N$, and outputs the disturbance signal $\omega_N$ to the motor control IC 10. The disturbance signal $\omega_N$ inputted to the motor control IC 10 is introduced to the control loop of the motor control unit 110 through the debug control unit 14 (referring to FIG. 3), and specifically, becomes an input signal of the adder 113.

The disturbance signal $\omega_N$ includes a noise including signal components of each frequency within a predetermined measurement target frequency band. The noise including signal components of each frequency within the predetermined measurement target frequency band is generated by scanning the frequency of the disturbance signal $\omega_N$ within a measurement target frequency band. In the control loop of the motor control unit 110, signals of state amounts or control amounts representing the speed command ω*, the rotating speed ω, the speed error Δω, the current command i*, the motor current i and the current error Δi are digital signals. Thus, the disturbance signal $\omega_N$ is generated in the form of the digital disturbance signal having an angular speed dimension. The type of the noise serving as the disturbance signal $\omega_N$ may be any as desired. The noise serving as the disturbance signal $\omega_N$ may be white noise, or may be color noise (e.g., pink noise or gray noise). The method for generating the digital disturbance signal (noise) may be implemented by any commonly known method. The request signal 71 specifies characteristics (a measurement target frequency band and signal amplitude) of the disturbance signal $\omega_N$, and the disturbance signal $\omega_N$ is generated as specified.

The subtractor 113 obtains the speed error Δω represented by "Δω=ω*−ω+$\omega_N$" as above. In practice, for example, in the subtractor 113, after a first calculation value (ω*−ω) is obtained, the speed error Δω represented by a second calculation value (ω*−ω+$\omega_N$) can be obtained. In the frequency characteristics measurement process, the debug control unit 14 (referring to FIG. 3) reads the first calculation value (ω*−ω) and the second calculation value (ω*−ω+$\omega_N$) from the subtractor 113, and sends a result signal 72 including the first calculation value (ω*−ω) and the second calculation value (ω*−ω+$\omega_N$) to the debugger 20. In practice, for example, the first and second calculation values are stored in a specific storage region in the memory 12 (may be the register of the CPU 11), and the debug control unit 14 acquires the first and second calculation values by reading the data stored in the specific storage region. Moreover, while the disturbance signal $\omega_N$ is inputted to the subtractor 113, the value of the speed command $\omega^*$ is fixed at a certain value.

The result signal 72 is transmitted from the debugger 20 to the PC 30, and the frequency characteristics deriver 32 derives the frequency characteristics of the control loop of the motor control unit 110 based on the result signal 72. The derived frequency characteristics herein are frequency characteristics with respect to the speed control loop of the motor 40 (to be simply referred to as frequency characteristics in this embodiment hereafter). The speed control loop is a control loop (feedback control system) that uses the speed command $\omega^*$ as an input and the rotating speed $\omega$ as an output, and includes and is formed by various constituting components represented by numerals 111, 113, 114, 115, 116, 117, 50 and 40. The speed control loop achieves speed control of coinciding or approximating the rotating speed $\omega$ with the speed command $\omega^*$. However, while the disturbance signal $\omega_N$ is inputted to the subtractor 113, the disturbance signal $\omega_N$ is superimposed on the speed command $\omega^*$, and thus the speed control loop becomes a control loop that uses the superimposed speed command ($\omega^*+\omega_N$) as an input and the rotating speed $\omega$ as an output, and performs speed control of coinciding or approximating the rotating speed $\omega$ with the superimposed speed command ($\omega^*+\omega_N$).

Figure 6:
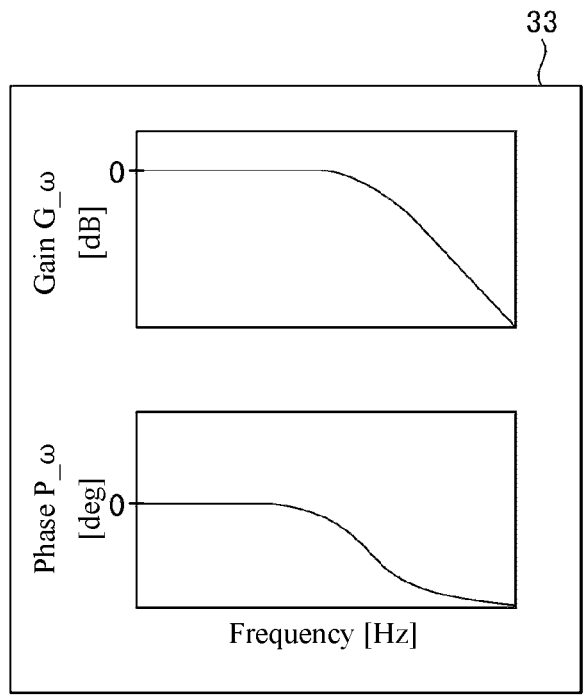
FIG. 6 is an example showing a derived Bode plot according to the first embodiment of the present disclosure.

In the PC 30, the frequency characteristics deriver 32 generates a Bode plot as a diagram representing the derived frequency characteristics, and as shown in FIG. 6, the generated Bode plot is displayed on the display 33. The Bode plot includes a gain diagram representing frequency dependency of the gain of the control loop, and a phase diagram representing frequency dependency of the phase of the control loop. The control loop of attention of this embodiment is a speed control loop that performs speed control, and for illustration purposes, the gain and phase of the speed control loop are respectively represented by symbols $G\_\omega$ and $P\_\omega$. The gain $G\_\omega$ and the phase $P\_\omega$ are a gain and a phase of a transfer function that uses the speed command $\omega^*$ as an input and the rotating speed $\omega$ as an output. That is, the gain $G\_\omega$ represents a ratio of the amplitude of the rotating speed $\omega$ to the amplitude of the speed command $\omega^*$, and the phase $P\_\omega$ represents a phase difference between a signal of the speed command $\omega^*$ and a signal of the rotating speed $\omega$ using the speed command $\omega^*$ as a reference.

As described above, in order to render a Bode plot, costly measurement equipment such as an FRA is frequently used. However, an FRA is not easily used as being much more costly. Moreover, an FRA mostly uses analog signals for measurement, and to measure frequency characteristics under digital control, processes that are not needed for general operations such as generating analog signals exclusive to the measurement are required. On the other hand, for a motor control device that performs digital control, situations in which a frequency characteristics measurement function is built in advance are also studied. However, since a frequency characteristics measurement function is not needed by original motor control, resources (such as memory capacity) of the motor control device may be constricted, leading to an increased product cost of the motor control device. Considering the situations above, in this embodiment, the disturbance signal superimposer 22 and the frequency characteristics deriver 32 in charge of the frequency characteristic measurement process are provided in an external debug device (the debugger 20 and the PC 30) of the motor control IC 10. Thus, no costly measurement equipment such as an FRA is needed. In addition, a cost increase in the motor control IC 10 is also suppressed because the frequency characteristics measurement function is centralized on the side of the external debug device (20 and 30). The motor control IC 10 is only required to perform common control for driving the motor 40.

In the description below, a state in which the external debug device (20 and 30) and the motor control IC 10 are connected is referred to as a connected state of the external debug device, and a state in which the external debug device (20 and 30) and the motor control IC 10 are not connected is referred to a disconnected state of the external debug device. In the connected state of the external debug device, the motor control IC 10 and the debugger 20 are connected by the wire 54 and the debugger 20 and the PC 30 are connected by the wire 57, and as described above, transfer of the disturbance signal $\omega_N$, the request signal 71 and the result signal 72 can be performed. In the disconnected state of the external debug device, the motor control IC 10 and the debugger 20 are not connected by the wire 54 and the debugger 20 and the PC 30 are not connected by the wire 57, and at least the disturbance signal $\omega_N$ is not inputted to the motor control IC 10.

In the motor control system of this embodiment, frequency characteristics can be measured at any moment while the motor 40 is driven, by connecting the external debug device (20 and 30) with the motor control IC 10. Accordingly, the disconnected state of the external debug device is considered as a starting point. In the disconnected state of the external debug device, driving of the motor 40 is controlled in a state in which "$\omega_N=0$" using the motor control unit 110, that is, the motor control IC 10 (the motor control unit 110) alone drives the motor 40 without involving the external debug device (20 and 30). In a state in which the motor 40 is currently driven and controlled, the disconnected state of the external debug device transitions to the connected state of the external debug device. In the connected state of the external debug device after the transition, the frequency characteristics superimposing process accompanied with superimposition of the disturbance signal $\omega_N$ can be performed, accordingly measuring and deriving the frequency characteristics without interrupting the driving control of the motor 40. For the motor control unit 110 in FIG. 5, the connected state and the disconnected state of the external debug device differ merely in that the speed commands are respectively $\omega^*$ and ($\omega^*+\omega_N$).

As such, the state in which the motor control IC 10 (motor control unit 110) alone controls driving of the motor 40 without superimposing the disturbance signal $\omega_N$ is used as a starting point, and the disturbance signal $\omega_N$ can be superimposed at any moment after that. If the disturbance signal $\omega_N$ is superimposed, while driving control of the motor 40 is continually performed using the motor control IC 10 (motor control unit 110), the frequency characteristics are derived by the frequency characteristics deriver 32.

The approach above is in particular beneficial for applications in which frequency characteristics need to be measured without interrupting driving of a motor (for example, an application in which the motor 40 is used in a conventional operation of fans of a base station). For example, it is deemed that frequency characteristics change along with degradation of the motor 40. Thus, given that a manager acting as the user periodically checks the frequency characteristics, the level of degradation of the motor 40 can be estimated, and practices such as replacing the motor 40 can be performed according to requirements. Moreover, selectively setting an operation mode to a normal mode or a measurement mode upon activation of a motor control device is also studied, and a virtual configuration such as frequency characteristic measurement can be performed only in the measurement mode, with however this virtual configuration being unsuitable for the application described above. In the configuration of this embodiment, at an expected moment during the operations of the motor control IC 10 and the motor 40, the frequency characteristics measurement process can be performed by simply connecting the external debug device (20 and 30) and the motor control IC 10.

Further, because the external debug device (20 and 30) originally provides a debug function, another signal (to be referred to as a monitor target signal) in the motor control IC 10 can be monitor at any moment of attention. The moment of attention herein may be any moment within a predetermined period in which the frequency characteristics derivation process is performed by superimposing the disturbance signal $\omega_N$. A period in which the disturbance signal $\omega_N$ is superimposed (that is, a period in which a non-zero disturbance signal $\omega_N$ is superimposed on the speed command $\omega^*$) belongs to the predetermined period. The monitor target signal can be any, given that it is a signal identified and processed in the motor control IC 10. However, the monitor target signal is different from a signal referenced by the frequency characteristics deriver 32 for deriving the frequency characteristics (that is, the signal representing the first calculation value ($\omega^*-\omega$) and the signal representing the second calculation value ($\omega^*-\omega+\omega_N$)). For example, the monitor target signal may be the signal representing the motor current i, or may be the signal representing the rotor position θ. Alternatively, a temperature signal representing the temperature of a predetermined measurement target position in the motor driving system may also be the monitor target signal. The measurement target position may be the temperature in the motor control IC 10, or may be the temperature outside the motor control IC 10 (for example, the temperature at a specific position in the motor 40).

By setting that any other signal can be monitor while the frequency characteristics derivation process is performed by superimposing the disturbance signal $\omega_N$, the control loop can be evaluated at detail or a debug operation needed can be improved. In a method independent from the method of this embodiment, another tool may be needed if another signal is to be referenced.

Figure 7:
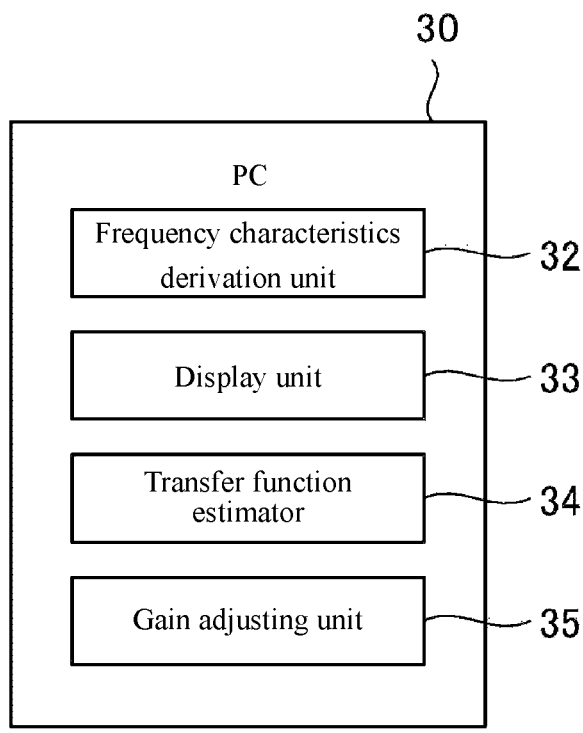
FIG. 7 is a block diagram of functions implemented using a personal computer (PC) according to the first embodiment of the present disclosure.

As shown in FIG. 7, a transfer function estimator 34 and a gain adjustor 35 may be further provided in the PC 30. The debug software 31 (referring to FIG. 1) is executed by the PC 30 to implement the function of the transfer function estimator 34 and the gain adjustor 35. Whether the transfer function estimator 34 operates or not may be set by the user as desired. The same applies to the gain adjustor 35.

The transfer function estimator 34 estimates a transfer function of the control loop in the motor control unit 110 based on the frequency characteristics derived by the frequency characteristics deriver 32. In the configuration in FIG. 5, the derived transfer function is a transfer function of the speed control loop that uses the speed command $\omega^*$ as an input and the rotating speed $\omega$ as an output, and represents the frequency characteristics derived by the frequency characteristics deriver 32 by a mathematical equation. The transfer function estimator 34 displays the derived transfer function on the display 33.

Some analysis models using mathematic equations can be applied for the motor 40, and a transfer function can be estimated according to the analysis models. For example, if it is deemed that the motor 40 is degraded, a change then occurs in the frequency characteristics, and a change may also occur in the transfer function. The user can consider replacing the motor 40 or consider adjusting control parameters of the motor 40 according to the level of degradation with reference to the estimated transfer function.

The gain adjustor 35 adjusts the gain $G\_\omega$ (that is, increasing or decreasing) of the control loop (herein speed control loop) according to the estimated transfer function. At this point, the gain adjustor 35 determines a recommended gain according to the estimated transfer function and a predetermined adjustment rule aimed for achieving stable control of the motor 40, and sets the recommended gain as the adjusted gain $G\_\omega$. Accordingly, stable control of the motor 40 is improved.

The method for adjusting the gain for any control loop is commonly known, and the gain adjustor 35 may use any commonly known gain adjusting method (for example, the gain adjusting method disclosed by Japan Patent Publication No. 2016-92935) to adjust the gain $G\_\omega$. For example, when the speed control unit 115 is formed as obtaining the current command i* based on the value of the speed error $\Delta\omega$ multiplied by an adjustment coefficient, the gain $G\_\omega$ may be increased or decreased by increasing or decreasing the adjustment coefficient in the speed control unit 115.

A process of modifying the gain $G\_\omega$ from a gain $G\_\omega1$ to a gain $G\_\omega2$ by the gain adjustor 35 may be performed as below. That is, the gain adjustor 35 sends a gain adjustment request signal including information of the gain $G\_\omega2$ to the debugger 20, and the debugger 20 sends the information of the $G\_\omega2$ to the motor control IC 10 in response to the received gain adjustment request signal. The information of the gain $G\_\omega2$ is transmitted to the motor control unit 110 through the debug control unit 14, and the gain $G\_\omega$ is accordingly modified from the gain $G\_\omega1$ to the gain $G\_\omega2$.

For the sake of convenience, the frequency characteristics derived by the frequency characteristics measurement process before adjusting the gain $G\_\omega$ are referred to as first frequency characteristics, and the Bode plot based on the first frequency characteristics is referred to as a first Bode plot. After the gain $G\_\omega$ is adjusted (in other words, after modifying the gain $G\_\omega$), the frequency characteristics measurement process is again performed by the external debug device (20 and 30). For the sake of convenience, the frequency characteristics derived by the frequency characteristics measurement process after adjusting the gain $G\_\omega$ are referred to as second frequency characteristics, and the Bode plot based on the second frequency characteristics is referred to as a second Bode plot. Once the second Bode plot is obtained after adjusting the gain $G\_\omega$, the gain adjustor 35 changes the Bode plot displayed on the display 33 from the first Bode plot to the second Bode plot, or the first and second Bode plots are displayed side by side on the display 33. Accordingly, the user can visually confirm the adjustment effects of the gain $G\_\omega$.

Second Embodiment

The second embodiment of the disclosure is described below. The second embodiment and third embodiment below are embodiments based on the first embodiment. With respect to items specifically described in the second and third embodiments, the details of the first embodiment are applicable to the second and third embodiments, given that no contradictions are incurred. In the description associated with the second embodiment, the details associated with the second embodiment overrule in case of contradictions between the first and second embodiments (the same applies to the third embodiment below). Without incurring contradictions, any multiple implementations in the first to third embodiments may be combined.

Figure 8:
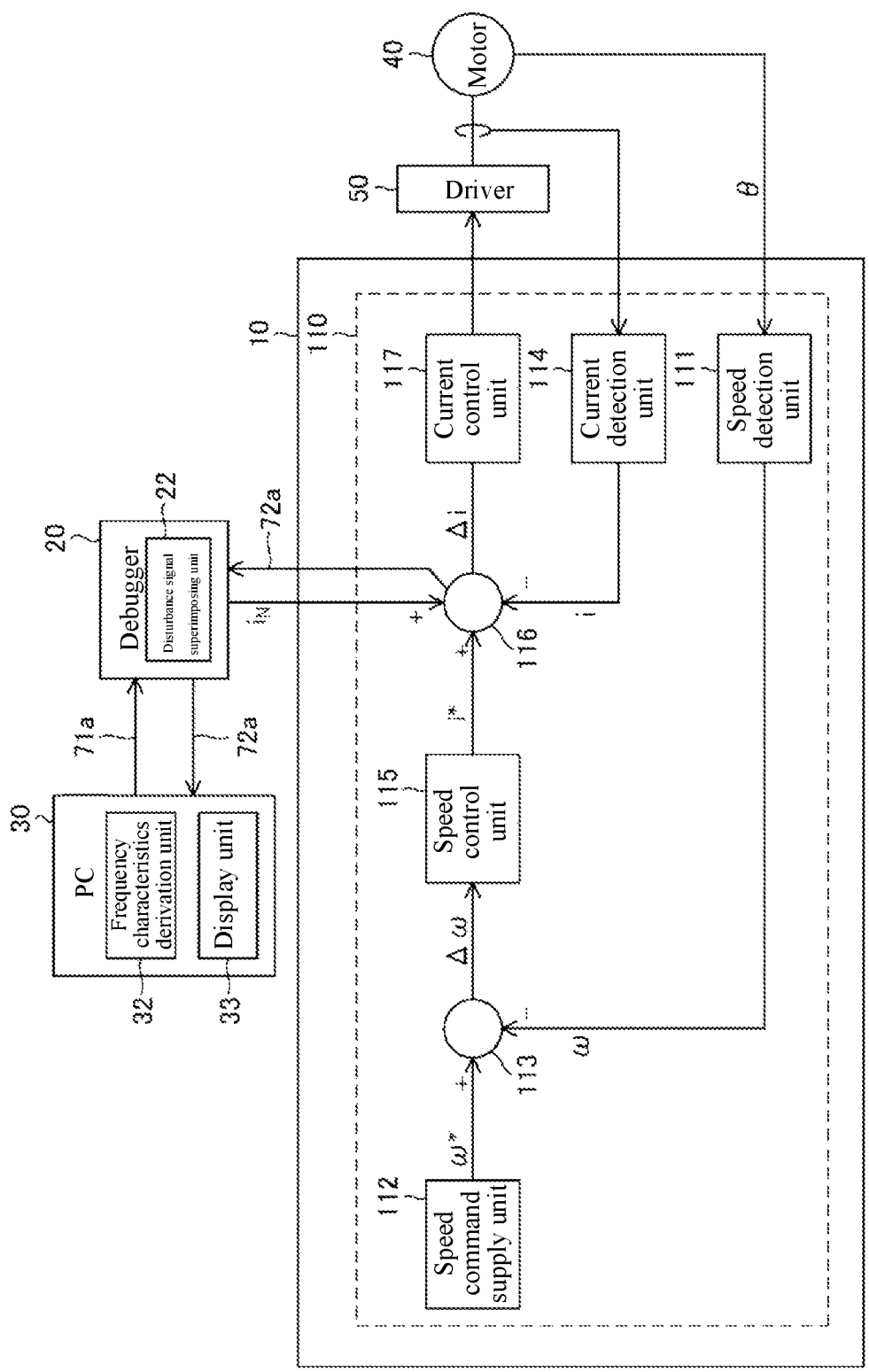
FIG. 8 is a functional block diagram of a motor control system according to a second embodiment of the present disclosure.

In the motor driving system of the present disclosure, the control loop as a frequency characteristics measurement target is not limited to a speed control loop. As an example, FIG. 8 depicts a configuration of a current control loop set as a frequency characteristics measurement target. FIG. 8 shows a functional block diagram of a motor control system according to the second embodiment. The configuration and operation of the motor control unit 110 provided on the motor control IC 10, and the configurations and operations of the driver 50 and the motor 40 are as those given in the first embodiment. However, in this configuration of FIG. 8, the frequency characteristics of the current control loop are measured by superimposing a disturbance signal $i_N$ on the current command i* but not on the speed command ω*. Details on items common between the first and second embodiments are omitted herein, and differences between the two are described.

Similar to the description above, the subtractor 116 obtains a current difference Δi between a signal of a motor current i detected by the current detection unit 114 and a signal of a current command i* provided from the speed control unit 115 based on these two signals. However, to obtain the current error Δi, a disturbance signal $i_N$ is sometimes inputted from the debugger 20 to the subtractor 116 (that is, sometimes the disturbance signal $i_N$ is superimposed on the current command ω*), and the current error Δi obtained is then represented as "Δi=i*−i+$i_N$". In FIG. 8, the disturbance signal $i_N$ is inputted to the subtractor 116. When the disturbance signal $i_N$ is not inputted to the subtractor 116, "$i_N$=0", and thus "Δi=i*−i".

Two feedback loops are formed in the motor control unit 110. Between the two feedback loops, one is a speed control loop as a main loop, and the other is a current control loop as a secondary loop. The current control loop is a control loop (feedback control system) that uses the current command i* as an input and the motor current i as an output, and includes and is formed by various constituting components represented by numerals 114, 116, 117 and 50. The current control loop achieves current control of coinciding or approximating the motor current i with the current command i*. However, while the disturbance signal $i_N$ is inputted to the subtractor 116, the disturbance signal $i_N$ is superimposed on the current command i*, and thus the current control loop becomes a control loop that uses the superimposed current command (i*+$i_N$) as an input and the motor current i as an output, and performs current control of coinciding or approximating the motor current i with the superimposed current command (i*+$i_N$).

A frequency characteristics measurement process associated with the configuration in FIG. 8 is described below. After the user inputs a predetermined frequency characteristics instruction operation to the PC 30, a request signal 71a is sent from the PC 30 (for example, from the frequency characteristics deriver 32) to the debugger 20. After the debugger 20 receives the request signal 71a, the disturbance signal superimposer 22 generates the disturbance signal $i_N$, and outputs the disturbance signal $i_N$ to the motor control IC 10. The disturbance signal $i_N$ inputted to the motor control IC 10 is introduced to the control loop of the motor control unit 110 through the debug control unit 14 (referring to FIG. 3), and specifically, becomes an input signal of the adder 116.

The disturbance signal $i_N$ includes a noise including signal components of each frequency within a predetermined measurement target frequency band. The noise including signal components of each frequency within the predetermined measurement target frequency band is generated by scanning the frequency of the disturbance signal $i_N$ within a measurement target frequency band. Thus, the disturbance signal $i_N$ is generated in the form of the digital disturbance signal having an electrical current dimension. The type of the noise serving as the disturbance signal $i_N$ may be any as desired. The noise serving as the disturbance signal $i_N$ may be white noise, or may be color noise (e.g., pink noise or gray noise). The request signal 71a specifies characteristics (a measurement target frequency band and signal amplitude) of the disturbance signal $i_N$, and the disturbance signal $i_N$ is generated as specified.

The subtractor 116 obtains the current error Δi represented by "Δi=i*−i+$i_N$" as above. In practice, for example, in the subtractor 116, after a first calculation value (i*−i) is obtained, the current error Δi represented by the second calculation value (i*−i+$i_N$) can be obtained. In the frequency characteristics measurement process, the debug control unit 14 (referring to FIG. 3) reads the first calculation value (i*−i) and the second calculation value (i*−i+$i_N$) from the subtractor 116, and sends a result signal 72a including the first calculation value (i*−i) and the second calculation value (i*−i+$i_N$) to the debugger 20. In practice, for example, the first and second calculation values are stored in a specific storage region in the memory 12 (may be the register of the CPU 11), and the debug control unit 14 acquires the first and second calculation values by reading the data stored in the specific storage region.

The result signal 72a is transmitted from the debugger 20 to the PC 30, and the frequency characteristics deriver 32 derives the frequency characteristics of the control loop of the motor control unit 110 based on the result signal 72a. The derived frequency characteristics herein are frequency characteristics with respect to the current control loop of the motor 40 (to be simply referred to as frequency characteristics in this embodiment hereafter).

In the PC 30, the frequency characteristics deriver 32 generates a Bode plot as a diagram representing the derived frequency characteristics, and as shown in FIG. 6, the generated Bode plot is displayed on the display 33. The Bode plot includes a gain diagram representing frequency dependency of the gain of the control loop, and a phase diagram representing frequency dependency of the phase of the control loop. The control loop of attention in this embodiment is the current control loop that performs current control. For the sake of convenience, the gain and phase of the current control loop are respectively represented by symbols G_i and P_i, and gain G_i and the phase P_i are a gain and a phase of a transfer function that uses the current command i* as an input and the motor current i as an output. That is, the gain G_i represents a ratio of the amplitude of the motor current i to the amplitude of the current command i*, and the phase P_i represents a phase difference between a signal of the current command i* and a signal of the motor current i using the current command i* as a reference.

In the second embodiment, similar to the first embodiment, frequency characteristics can be measured at any moment while the motor 40 is driven, by connecting the external debug device (20 and 30) with the motor control IC 10. That is, the state in which the motor control IC 10 (motor control unit 110) alone controls driving of the motor 40 without superimposing the disturbance signal $i_N$ is used as a starting point, and the disturbance signal $i_N$ can be superimposed at any moment after that. If the disturbance signal $i_N$ is superimposed, while driving control of the motor 40 is continually performed using the motor control IC 10 (motor control unit 110), the frequency characteristics (frequency characteristics of the current control loop) are derived by the frequency characteristics deriver 32.

Moreover, without incurring contradictions, the techniques described in the first embodiment may be applied to the implementation of the second embodiment. However, in the application, the disturbance signal $\omega_N$ in the first embodiment is otherwise referred to as the disturbance signal $i_N$ in the second embodiment. That is, for example, in the configuration in FIG. 8, the PC 30 may be provided with the transfer function estimator 34 and the gain adjustor 35 (referring to FIG. 7). The transfer function estimator 34 estimates a transfer function of the control loop in the motor control unit 110 based on the frequency characteristics derived by the frequency characteristics deriver 32. In the configuration in FIG. 8, the derived transfer function is a transfer function of the current control loop that uses the current command i* as an input and the motor current i as an output, and represents the frequency characteristics derived by the frequency characteristics deriver 32 by a mathematical equation. The transfer function estimator 34 displays the derived transfer function on the display 33. Moreover, the gain adjustor 35 adjusts (that is, increasing or decreasing) the gain of the control loop (the current control loop herein) according to the estimated transfer function.

The configuration capable of measuring the frequency characteristics of a current control loop is described with reference to FIG. 8. However, apart from the above, a position control loop (not shown) that controls the rotor position θ according to a position command θ* may also be formed in the motor control unit 110. In this case, frequency characteristics of the position control loop can be derived by superimposing a disturbance signal on the position command θ*.

Third Embodiment

The third embodiment of the disclosure is described below.

The motor control system of the present disclosure specifically described by way of examples in the first and second embodiments includes: a motor control device, including a semiconductor integrated circuit having a memory (12), and forming a control loop (for example, a speed control loop) for a motor (40) so as to control driving of the motor; and an external debug device (20 and 30), externally connected to the motor control device, capable of accessing the memory, the external debug device including a disturbance signal superimposer (22) and a frequency characteristics deriver (32). The interference signal superimposer (22) generates a disturbance signal (for example, $\omega_N$) for the control loop and superimposes the disturbance signal on a signal generated in the control loop. The frequency characteristics deriver (32) derives frequency characteristics of the control loop based on the signal generated in the control loop by superimposition. Herein, it may be considered that the motor control device corresponds to the motor control IC 10 or corresponds to the motor control unit 110.

Moreover, in the first embodiment (referring FIG. 5), introducing (injecting) the disturbance signal $\omega_N$ to the control loop of the motor control unit 110 is in fact implemented by the operation of the memory 12 that stores data inputted and outputted by the subtractor 113. Similarly, in the second embodiment (referring FIG. 8), introducing (injecting) the disturbance signal $i_N$ to the control loop of the motor control unit 110 is in fact implemented by the operation of the memory 12 that stores data inputted and outputted by the subtractor 116. According to the disturbance signal introducing method based on the operation of the memory, a disturbance signal may be freely introduced (injected) to any part in the control loop. The above is significantly better than the method below; that is, leading out a signal line of hardware, and directly injecting a disturbance signal to a target part through the signal line.

Figure 9:
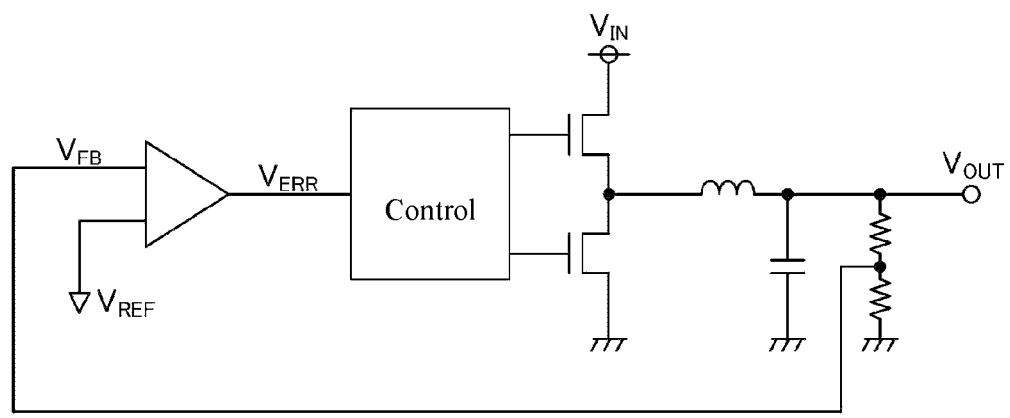
FIG. 9 is a diagram of a brief configuration of a power supply device according to a third embodiment of the present disclosure.

The method for deriving frequency characteristics of a control loop in the examples described in the first and second embodiments is applicable to any device and system having a control loop (feedback control system). For example, the derivation method is applicable to a power supply device (direct-current-to-direct-current (DC/DC) converter) generating another DC output voltage $V_{OUT}$ from a DC input voltage $V_{IN}$, as shown in FIG. 9. In the power supply device in FIG. 9, a boot signal of a difference between a feedback voltage $V_{FB}$ and a predetermined reference voltage $V_{REF}$ proportional to the output voltage $V_{OUT}$ is used as an error voltage $V_{ERR}$, and feedback control of coinciding or approximating the error voltage $V_{ERR}$ with the zero (hence feedback control of coinciding or approximating the feedback voltage $V_{FB}$ with the reference voltage $V_{REF}$) is performed, accordingly stabilizing the output voltage $V_{OUT}$ at a target voltage corresponding to the reference voltage $V_{REF}$.

When frequency characteristics of a control loop in the power supply device are measured, a disturbance signal $V_N$ serving as noise is superimposed on the reference voltage $V_{REF}$. Feedback control of coinciding or approximating the feedback voltage $V_{FB}$ and the difference of the voltages ($V_{REF}+V_N$) with zero is performed in a period in which the disturbance signal $V_N$ is superimposed. Then, based on the voltages ($V_{REF}-V_{FB}$) and ($V_{REF}-V_{FB}+V_N$) of that period, frequency characteristics of the control loop (feedback control system) that coincides or approximates the feedback voltage $V_{FB}$ with the reference voltage $V_{REF}$ can be derived.

Various modifications may be made to the embodiments of the disclosure with the scope of the technical concept of the claims. The embodiments above are only examples of possible implementations of the disclosure, and the meanings of the terms of the disclosure or the constituting components are not limited to the meanings of the terms used in the embodiments above. The specific numerical values used in the description are only examples, and these numerical values may be modified to various other numerical values.

What is claimed is:

1. A motor control system, comprising:
a motor control device, including a semiconductor integrated circuit having a memory and forming a control loop for a motor to control a drive of the motor; and
an external debug device, externally connected to the motor control device and accessible to the memory in the motor control device, wherein the control loop is operable to be independent of the external debug device and is operable, when disconnected from the external debug device, to generate a signal indicating a target value of a rotating speed and to access the memory in the motor control device, and wherein the external debug device includes:

a disturbance signal superimposer, configured to generate a disturbance signal for the control loop, and to transmit the disturbance signal through writing the disturbance signal to the memory in the motor control device when the external debug device is connected to the motor control device; and a frequency characteristic deriver, configured to derive frequency characteristics of the control loop based on the signal generated in the control loop by superimposition, wherein the external debug device includes:

a debugger including an external signal output unit and externally connected to the motor control device and is arranged between a computing device and the motor control device and wherein under an instruction of the computing device, the disturbance signal is superimposed, wherein the motor control device is configured to read the disturbance signal from the memory and superimpose the disturbance signal to the signal in the control loop, and the external debug device is configured to monitor a temperature signal representing a temperature of a predetermined measurement target position in the motor control system so as to monitor the motor control system during derivation of the frequency characteristics.

2. The motor control system of claim 1, wherein the external debug device further includes:

the computing device including the frequency characteristic deriver, wherein the signal generated in the control loop by superimposition is transmitted from the motor control device to the computing device via the debugger.

3. The motor control system of claim 1, wherein the external debug device further includes a display operable to display a Bode plot as a diagram showing the frequency characteristics.

4. The motor control system of claim 2, wherein the external debug device further includes a display that displays a Bode plot as a diagram showing the frequency characteristics.

5. The motor control system of claim 1, wherein the frequency characteristics are derived by the frequency characteristic deriver while the drive of the motor is continually controlled by the motor control device when the disturbance signal is superimposed starting from a state in which the motor control device controls the drive of the motor without superimposing the disturbance signal.

6. The motor control system of claim 2, wherein the frequency characteristics are derived by the frequency characteristic deriver while the drive of the motor is continually controlled by the motor control device when the disturbance signal is superimposed starting from a state in which the motor control device controls the drive of the motor without superimposing the disturbance signal.

7. The motor control system of claim 3, wherein the frequency characteristics are derived by the frequency characteristic deriver while the drive of the motor is continually controlled by the motor control device when the disturbance signal is superimposed starting from a state in which the motor control device controls the drive of the motor without superimposing the disturbance signal.

8. The motor control system of claim 1, wherein the external debug device further includes a transfer function estimator operable to estimate a transfer function of the control loop based on the derived frequency characteristics.

9. The motor control system of claim 2, wherein the external debug device further includes a transfer function estimator operable to estimate a transfer function of the control loop based on the derived frequency characteristics.

10. The motor control system of claim 3, wherein the external debug device further includes a transfer function estimator operable to estimate a transfer function of the control loop based on the derived frequency characteristics.

11. The motor control system of claim 5, wherein the external debug device further includes a transfer function estimator operable to estimate a transfer function of the control loop based on the derived frequency characteristics.

12. The motor control system of claim 8, wherein the external debug device further includes a gain adjustor to adjust a gain of the control loop based on the estimated transfer function.

13. The motor control system of claim 1, wherein the motor control device is operable to control the speed to match or approach the rotation speed of the motor with respect to a speed command in the control loop, and wherein the external signal output unit superimposes the disturbance signal on the speed command.

14. The motor control system of claim 1, wherein the disturbance signal superimposer is operable to generate a digital noise including signal components of each frequency within a predetermined band as the disturbance signal.

* * * * *